(12) United States Patent
Seidler et al.

(10) Patent No.: US 11,118,286 B2
(45) Date of Patent: Sep. 14, 2021

(54) SURFACE PIECE

(71) Applicant: SEFAR AG, Heiden (CH)

(72) Inventors: Rouven Seidler, Waldstatt (CH); Peter Chabrecek, Freidorf (CH)

(73) Assignee: SEFAR AG, Heiden (CH)

( * ) Notice: Subject to any disclaimer, the term of this patent is extended or adjusted under 35 U.S.C. 154(b) by 279 days.

(21) Appl. No.: 16/437,080

(22) Filed: Jun. 11, 2019

(65) Prior Publication Data

US 2019/0292696 A1 Sep. 26, 2019

Related U.S. Application Data

(63) Continuation of application No. 13/057,005, filed as application No. PCT/EP2009/005659 on Aug. 5, 2009, now Pat. No. 10,358,749.

(30) Foreign Application Priority Data

| Aug. 5, 2008 | (DE) | 10 2008 036 383.9 |
| Aug. 26, 2008 | (DE) | 10 2008 039 709.1 |
| Nov. 5, 2008 | (DE) | 10 2008 055 973.3 |

(51) Int. Cl.
*B32B 17/10* (2006.01)
*D03D 9/00* (2006.01)
(Continued)

(52) U.S. Cl.
CPC .............. *D03D 9/00* (2013.01); *B32B 5/024* (2013.01); *B32B 17/10036* (2013.01); *B32B 17/10247* (2013.01); *B32B 17/10761* (2013.01); *B32B 27/08* (2013.01); *B32B 27/12* (2013.01); *B32B 27/30* (2013.01); *B32B 27/306* (2013.01); *B32B 27/40* (2013.01); *D03D 1/007* (2013.01); *D06M 11/83* (2013.01); *D06P 5/00* (2013.01); *D06P 5/12* (2013.01); *B32B 2255/02* (2013.01); *B32B 2255/205* (2013.01); *B32B 2262/0276* (2013.01); *B32B 2262/0292* (2013.01); *B32B 2307/404* (2013.01); *B32B 2307/412* (2013.01); *B32B 2307/712* (2013.01); *B32B 2307/75* (2013.01);
(Continued)

(58) Field of Classification Search
CPC ..................................................... B32B 17/10
See application file for complete search history.

(56) References Cited

U.S. PATENT DOCUMENTS

| 2,630,620 A | 3/1953 | Rand |
| 3,305,623 A | 2/1967 | Bakker et al. |

(Continued)

FOREIGN PATENT DOCUMENTS

| DE | 10 2004 060 105 A1 | 1/2006 |
| JP | 2007-211353 A | 8/2007 |

(Continued)

*Primary Examiner* — Andrew T Piziali
(74) *Attorney, Agent, or Firm* — Bachman & LaPointe, PC; George Coury

(57) ABSTRACT

A surface piece of crossing threads (12, 14) comprising plastic filaments, which as a woven fabric web (10) is equipped with two mutually opposing surfaces and with openings (16) formed therein. The fabric web comprises a metallisation applied on one side as a surface layer and between 15 and 80%, in particular between 20 and 70% of the fabric web is configured in the form of network intermediate spaces (16).

11 Claims, 1 Drawing Sheet

(51) Int. Cl.
*B32B 27/08* (2006.01)
*B32B 27/12* (2006.01)
*B32B 27/30* (2006.01)
*B32B 27/40* (2006.01)
*D03D 1/00* (2006.01)
*D06M 11/83* (2006.01)
*D06P 5/00* (2006.01)
*D06P 5/12* (2006.01)
*B32B 5/02* (2006.01)
*H01L 31/02* (2006.01)

(52) U.S. Cl.
CPC ....... *B32B 2451/00* (2013.01); *B32B 2590/00* (2013.01); *H01L 31/02021* (2013.01); *Y10T 428/12535* (2015.01); *Y10T 428/24802* (2015.01); *Y10T 442/3382* (2015.04)

(56) References Cited

U.S. PATENT DOCUMENTS

| | | |
|---|---|---|
| 3,864,160 A | 2/1975 | Davidoff |
| 4,208,318 A | 6/1980 | Ono et al. |
| 4,230,763 A | 10/1980 | Skolnick |
| 5,012,041 A | 4/1991 | Sims et al. |
| 5,849,402 A | 12/1998 | Kraemling et al. |
| 6,004,649 A | 12/1999 | Nagata |
| 6,090,473 A | 7/2000 | Yoshikawa et al. |
| 6,503,636 B1 | 1/2003 | Le Masson et al. |
| 6,720,082 B1 * | 4/2004 | Hashimoto ....... B32B 17/10018 428/437 |
| 2006/0057332 A1 | 3/2006 | Li |
| 2007/0234533 A1 | 10/2007 | Dennler et al. |
| 2009/0197043 A1 | 8/2009 | Dennler et al. |

FOREIGN PATENT DOCUMENTS

| | | |
|---|---|---|
| WO | 00/04105 A2 | 1/2000 |
| WO | 2006030254 A1 | 3/2006 |

* cited by examiner

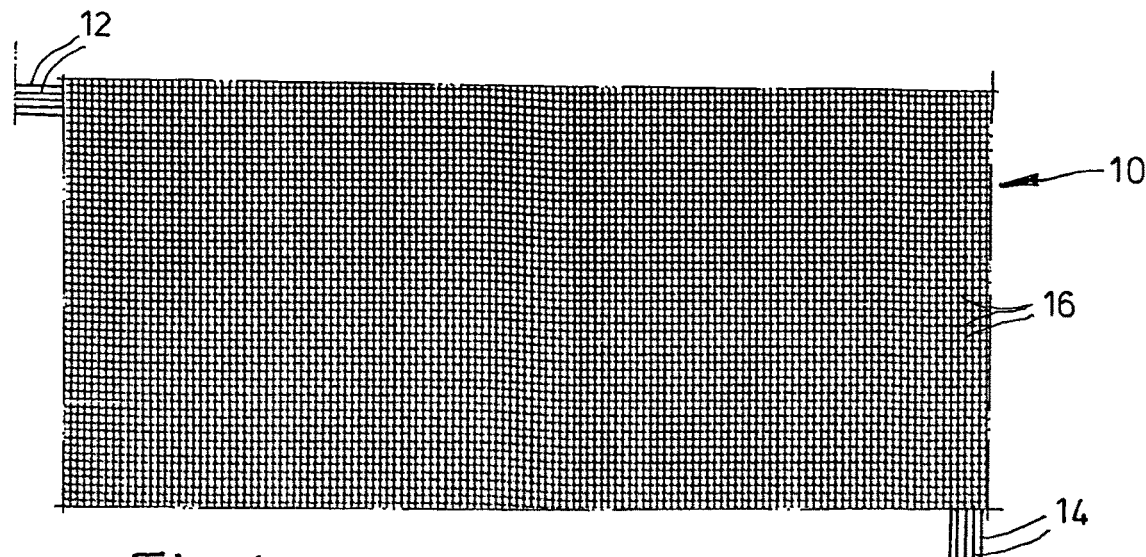
Fig.1
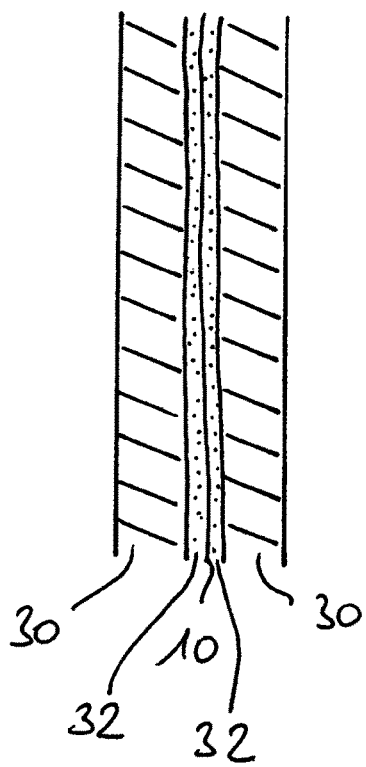
Fig. 2
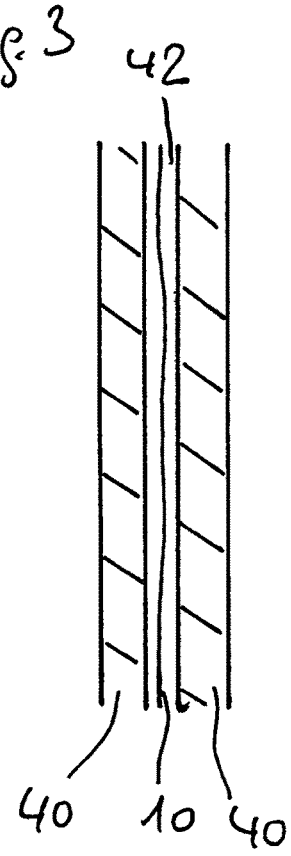
Fig. 3
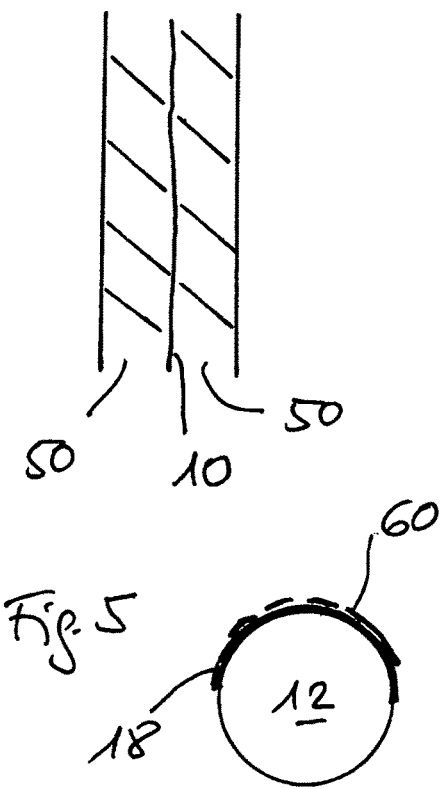
Fig. 4
Fig. 5

SURFACE PIECE

CROSS-REFERENCE TO RELATED APPLICATIONS

This is a continuation of U.S. patent application Ser. No. 13/057,005 filed Apr. 11, 2011, which is a US national stage application of PCT/EP2009/005659 filed Aug. 5, 2009 the disclosure of which is incorporated by reference herein in its entirety as if set forth at length.

BACKGROUND OF THE INVENTION

The present invention relates to a surface piece of crossing threads made of plastic filaments as a woven fabric web.

Such a device is generally known from the prior art and is possibly disclosed in the form of DE 10 2004 060 105 A1 of the applicant as a self-adhesive printing substrate of perforated films and papers. Such a fabric web is white on the front side and black on the back side; a printed pattern or the like is applied to the white side. If this printing substrate is mounted on a window pane or on a corresponding transparent surface carrier element, the printing is therefore extensively visible from outside but from inside, the observer can see towards the outside through the black surface; for him the printed pattern provided on the white surface side remains invisible. Such a procedure particularly advantageously possibly allows the formation of larger advertising surfaces which on the one hand are transparent from inside, on the other hand should ensure protection from the sun and visual protection. The black back surface also has the advantage that the view of an observer is concentrated on processes on the other surface side (assuming a brighter external environment).

At the same time, it has been found in the practice of using such fabrics that in particular from the viewpoints of light (sun) reflection on an outer side, a typical application in the architecture or building area, there is a need for improvement here as before since light reflection of incident light in particular (and therefore a desired shading of an interior) needs to be improved still further, which, however, can only be ensured up to a certain limit by the known outer-side white coloration.

It is an object of the present invention to improve a generic surface piece comprising a fabric web in regard to light transmission properties, suitability in particular for large-area cladding of architectural objects or the like, as well as additional visual and aesthetic effects.

SUMMARY OF THE INVENTION

The foregoing object is achieved by the surface piece of crossing threads comprising plastic filaments, which as a woven fabric web is equipped with two mutually opposing surfaces and with openings formed therein, characterised in that the fabric web comprises a metallisation applied on one side as a surface layer and between 15 and 80%, in particular between 20 and 70% of the fabric web is configured in the form of network intermediate spaces.

In an advantageous manner according to the invention, there is provided a plastic filament woven web which is provided (merely) on one side with a metallisation whilst the second surface remains as plastic filament (advantageously and according to a further development, coloured black).

A fabric web thus configured, in particular with a fraction of network intermediate spaces as open areas in the range between 15 and 80% of the entire area of the fabric web, therefore offers the best conditions for architectural and design freedoms: on the one hand, as before, the (preferably black) plastic surface as a side facing the interior, provides an almost perturbation-free, glare-proof view into the exterior, whilst the metallised outer surface on the other hand allows the greatest possible design freedom as an attractive metal outer surface which, additionally if desired, can be printed simply and using a metallic priming effect according to a further development. The metallisation has also proved to be particularly favourable with respect to incident solar rays or similar ambient light, and an advantageous one-sided application according to the invention of a metal such as Al, Cu, Cr, Ti, Au, AlCu or other suitable metals capable of being sputtered or vapour-deposited, is exceptionally suitable for a cost-effective, yet reliable and high-quality surface configuration.

For the metallisation, an application thickness in the range between 50 and 200 nm, in particular in the range between 60 and 120 nm, as a metallisation layer thickness on a fibre (a plastic filament) has proved to be particularly preferred, wherein according to a further development, the metallisation can also take place in a multilayer manner, possibly in the form of an underlying first metal layer (for example, Al is particularly suitable for this purpose) with a second metal layer (possibly Au, Cu, AlCu or the like) applied thereon. Here, suitable desired optical effects can be achieved, also a particularly favourable adhesion and/or stabilisation of the outermost visible layer can be achieved in this way.

For the fabric web having the fraction of open area specified according to the invention, a fabric thickness in the range between 100 and 400 µm, further preferably between 140 and 260 µm, is particularly suitable, wherein it has been found to be preferable that a fabric web tending to be rather thin, that is in the range of about 140 µm, also achieved particularly favourable optical effects if this thin fabric thickness occurs in combination with very open fabric (that is in the range of about 70%).

In the further development according to the invention, it has proved to be particularly preferable to use the fabric web of the surface piece together with transparent or partially transparent carrier materials such as glass or plastic plates in order to thus produce modular, surface pieces particularly suitable for architectural or building purposes in a particularly suitable manner and within the framework of the invention.

To this end, according to a first preferred embodiment, it is favourable to fasten a fabric web metallised on one side on a glass or plastic plate by means of an interposed film-like plastic layer, wherein it is further preferred that this exemplary embodiment is implemented in a doubled—sandwich-like manner so that on both sides the central fabric web is followed by respectively one of the plastic films and then respectively one of the glass or plastic plates. With an advantageous selection of the film possibly as PVB (alternatively PVA, EVA, TPU or the like) having a favourable thickness in the range between 0.2 and 2 mm, preferably between 0.38 and 0.76 mm, following autoclaving or vacuum treatment to avoid the occurrence of harmful air bubbles or the like, it is possible to produce a laminate which combines in a particularly elegant manner advantageous optical and architectural properties with high rupture safety (wherein according to a further development, composite or safety glass can be used in particular here as plate material).

A second alternative embodiment of the invention for producing modular surface pieces provides that the fabric web is clamped between two glass layers at the edge, wherein this embodiment favourably and advantageously provides that a cavity formed between the glass layers or the fabric web metallised on one side has a vacuum, alternatively a protective and/or inert gas filling.

A third variant to achieve modular surface pieces, again favourably for architectural or building purposes, but not restricted to this area of application, provides that the fabric web is inserted directly between plastic plates, where a subsequent heat treatment of the plastic plates then produces a corresponding softening or fusing of said plates and produces a mechanical bonding with the fabric web, again with the previously described advantageous effects.

The present invention offers arbitrary possibilities for producing decorative surface layers. In this context, it is on the one hand covered by the invention to use the metallisation as a decorative surface layer itself, in this respect the term "printed pattern" is also to be understood as metallisation. Alternatively, the metallisation itself in turn provides excellent priming for a layer used for printing to be applied thereon, possibly by means of sublimation or digital printing. The metallisation is not only favourably suitable as an adhesive substrate, as well as a visually attractive backlighting or gloss border for an additional printing of a printed pattern to be applied can be achieved, particularly if this additional printed pattern (possibly relative to the cross-sectional shape of a metallised fibre) leaves an unprinted metallised area at the edge.

As a result, an attractive, easy to process and highly flexible surface piece is produced by the present invention, which combines exceptional visual properties with the best possible suitability for the building, facade and/or architectural area, since possibilities for embedding the fabric web in corresponding support structures provided advantageously and according to further developments allow optimum protection and resistance to weathering, even over long lifetimes.

BRIEF DESCRIPTION OF THE DRAWINGS

Further advantages, features and details of the invention are obtained from the following description of preferred exemplary embodiments and with reference to the drawings; these show in:

FIG. 1: a schematic plan view of a fabric web metallised on one side for implementing a first embodiment of the present invention;

FIG. 2 shows a longitudinal section through an arrangement comprising a fabric web accompanied on both sides by a plastic film layer and a glass plate as a laminate arrangement;

FIG. 3 shows a longitudinal section through an insulating glass arrangement with a fabric web metallised on one side, spanned between two glass layers;

FIG. 4 shows as a third embodiment an implementation of a composite material comprising fabric web (metallised on one side) between two plastic materials in the mechanically connected state and FIG. 5: shows a detailed view of a printed pattern additionally applied to the metallisation, viewed in isolation for an individual fibre.

DETAILED DESCRIPTION

FIG. 1 shows a fabric web 10 which is woven in a netlike manner from crossing polyurethane (PU) threads 12, 14, the thread networks defining intermediate spaces 16 of approximately square shape. These intermediate spaces as open area form approximately 40% of the entire area.

The threads 12, 14 are plastic filaments of a monofilament synthetic fabric one surface whereof is vapour-coated on one side with a metallisation (here: aluminium having a layer thickness of about 80 nm).

FIG. 2 shows in the longitudinal sectional view how the fabric web 10 from FIG. 1 is inserted in the manner of a double laminate between a pair of glass plates 30 (typical thickness about 7 mm in each case), where a thin film 32 of polyvinyl butyral (PVB) is inserted between the respective glass plates 30 and the central fabric web 10. The arrangement is treated by autoclaving in vacuum (to avoid disadvantageous air bubbles) such that a firm, undetachable composite arrangement is formed which, with its metallic outer side and its visible fabric inner side made of black plastic fabric, is exceptionally suitable for a plurality of building and architectural applications, in particular because individual modules are formed in the manner shown in FIG. 2, which can be easily built in as surface pieces or plates.

FIG. 3 shows a variant for implementing such modules: here the fabric web 10 from FIG. 1 is clamped between two glass layers 40, the clamping taking place at the edge. An incipient cavity 42 is filled with a protective gas. This arrangement is also suitable for the building or architectural purposes described (and is furthermore almost unlimited in its range of application).

Finally FIG. 4 shows as an exemplary embodiment an arrangement in which the fabric web 10 from FIG. 1 is inserted directly between a pair of plastic plates 50; this arrangement was heated so that the polymeric material of the plastic plates 50 penetrates into the intermediate spaces of the fabric web and a mechanically stable, permanent connection is thus formed.

All the variants shown also enable a printed pattern to be applied to the metallisation 18 (FIG. 1); this can take place in an otherwise usual manner by techniques such as sublimation or digital printing.

Such a printed pattern in conjunction with the metallisation is particularly effective when the printed pattern is configured by a corresponding printing process such that, as illustrated in the detailed view in FIG. 5, the effect is produced that the metallisation 18 on the fibre 12 shown projects under the printing 60 at the edge, in other words the printing merely covers a partial area of the metallisation, but relative to a respective half fibre coating. In this way, the printing, which can be multicoloured in an otherwise known manner, acquires an attractive and metallic effect which allows creative free spaces.

Whilst the present invention was described primarily in connection with modular-configured surface pieces for architectural purposes or the like, the invention is not restricted to this. On the contrary, the present invention extends fundamentally to any surface pieces in which a plastic fabric having advantageous optical properties undergoes a metallisation on one side.

The invention claimed is:

1. A surface piece comprising a woven fabric web of crossing threads comprising plastic filaments, the woven fabric web has two mutually opposing surfaces and openings formed therein, the woven fabric web has a metallisation applied on only one surface of the opposing surfaces, wherein between 15 and 80% of the fabric web is configured in the form of network intermediate spaces, the metallisation has a thickness in the range between 50 and 200 nm and the woven fabric web is clamped between two glass layers, wherein a cavity between the glass layers has one of a vacuum, a protective gas filling and an inert gas filling.

2. The surface piece according to claim 1, wherein the metallisation comprises a metal which is selected from the group consisting of Au, Cu, Ti, Cr, Al, AlCu and/or alloys of these.

3. The surface piece according to claim 1, wherein the metallisation comprises a first underlying metal layer and a second metal layer applied thereon.

4. The surface piece according to claim 3, wherein the first underlying metal layer comprises Al and the second metal layer is selected from the group consisting of Au, AlCu and Cu.

5. The surface piece according to claim 1, wherein the metallisation has a thickness in the range between 60 and 120 nm.

6. The surface piece according to claim 1, wherein the plastic filaments comprise a monofilament of Pu or a polyester, and/or are colored black.

7. The surface piece according to claim 1, wherein the fabric web metallised on one side has a thickness in the range between 100 and 400 µm.

8. The surface piece according to claim 1, wherein the fabric web metallised on one side has a thickness in the range between 140 and 260 µm.

9. The surface piece according to claim 1, wherein that the woven fabric web (10) is clamped between two glass layers at the edge.

10. The surface piece according to claim 1, wherein a printed pattern is applied to the metallisation.

11. The surface piece according to claim 1, wherein only the surface of the woven fabric web has the metallisation.

* * * * *